United States Patent [19]

Kitamura et al.

[11] 4,258,397
[45] Mar. 24, 1981

[54] AUTOMATIC RECORDING LEVEL CONTROLLING CIRCUIT

[75] Inventors: Masatsugu Kitamura; Hideo Onoye; Masami Yamazaki, all of Yokohama, Japan

[73] Assignee: Victor Company of Japan, Limited, Japan

[21] Appl. No.: 41,821

[22] Filed: May 23, 1979

[30] Foreign Application Priority Data

May 28, 1978 [JP] Japan .................................. 53-63608
Jul. 19, 1978 [JP] Japan .................................. 53-87100

[51] Int. Cl.³ .......................... G11B 27/36; G11B 5/02
[52] U.S. Cl. ...................................... 360/31; 360/25; 360/68
[58] Field of Search .................. 360/31, 65, 66, 68, 360/67, 62, 25

[56] References Cited

U.S. PATENT DOCUMENTS

| | | | |
|---|---|---|---|
| 2,791,640 | 5/1957 | Wolfe | 360/25 |
| 4,011,585 | 3/1977 | Sunaga | 360/25 |

FOREIGN PATENT DOCUMENTS 2001221  1/1979  United Kingdom ...................... 360/68

*Primary Examiner*—Vincent P. Canney
*Attorney, Agent, or Firm*—Lowe, King, Price & Becker

[57] ABSTRACT

An automatic recording level controlling circuit comprises an audio test signal oscillator, a variable loss attenuation circuit, level detecting circuitry and a control circuit for controlling the attenuation factor of the variable loss attenuation circuit in accordance with the output of the level detecting circuitry. The level of a reproduced signal corresponding to the test signal is detected to see the deviation from a reference level so that the attenuation factor of the variable loss attenuation circuit is controlled in such a manner that the level of the reproduced signal is as close to the reference level as possible.

19 Claims, 8 Drawing Figures

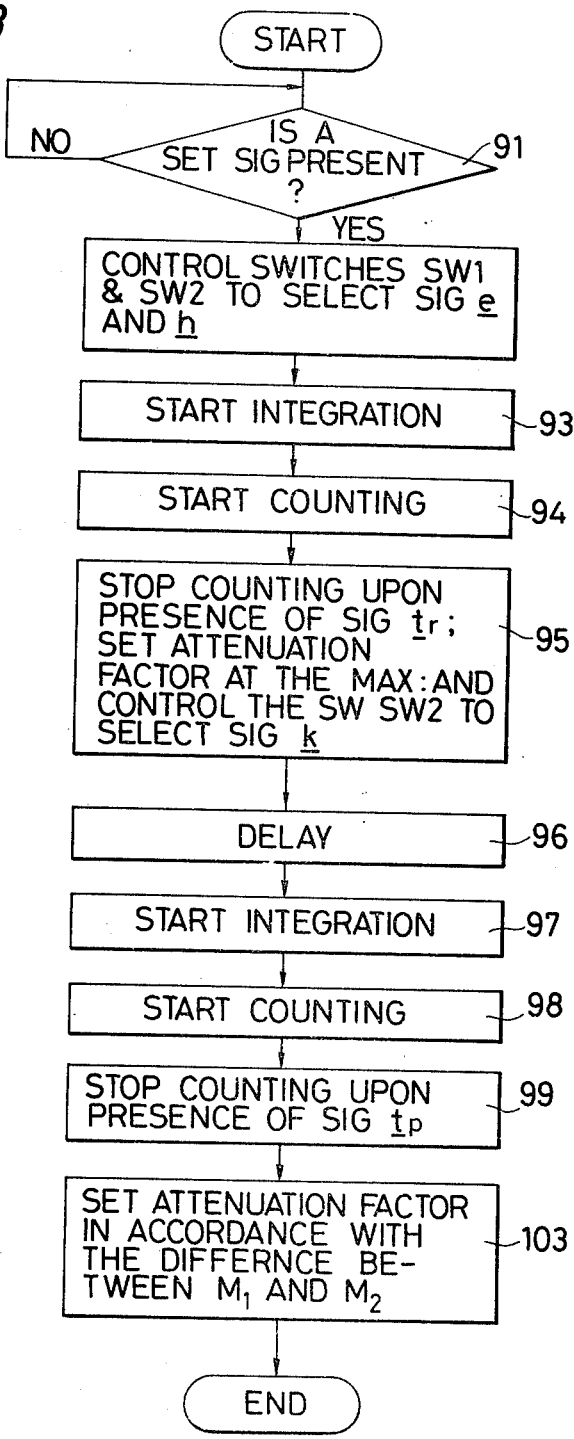

AUTOMATIC RECORDING LEVEL CONTROLLING CIRCUIT

FIELD OF THE INVENTION

This invention generally relates to a tape recording and reproducing apparatus. More particularly, the present invention relates to an automatic recording level controlling circuit which controls the level of an input audio signal prior to recording in such a manner that the level of a reproduced signal is as close as a reference level irrespectively of the sensitivity of the recording tape.

BACKGROUND OF THE INVENTION

Magnetic characteristics of recording magnetic tapes differ with kinds of tapes, such as normal tapes and chrome tapes, because of different magnetic materials used for tapes. Therefore, the bias level of the recording head has to be set in accordance with the kind of the recording tape for magnetically biasing the magnetic tape. Meanwhile, during reproducing the most suitable equalizer characteristic has to be set so as to restore the recorded signal properly. Some conventional tape recorders have a bias level selector switch and an equalizer characteristic selector switch for respectively setting the most suitable bias level for the recording head during recording and most suitable equalizer characteristic for the reproducing amplifier during reproducing.

Although these switches had to be manually operated, the inventors of the present invention had recently proposed, in a 'Japanese Patent application No. (53(1978)-35485) an automatic bias level setting circuit which automatically sets the most suitable bias level by means of an examination of the magnetic characteristic of the magnetic tape using a test bias signal.

Although the level of a bias signal is suitably set either manually or automatically to reduce distortion of the recording and reproducing signals, when the sensitivity of magnetic tapes differ from tape to tape of the same kind, the reproduced signals have variation in level. Here, the word sensitivity means the recording efficiency of a magnetic recording tape. This variation in sensitivity of recording tapes causes a tape recorder to erroneously reproduce the original recording signal so that high-fidelity reproduction is not achieved.

Especially when a compression-expansion type noise reduction method, such as Dolby noise reduction technique, is adopted, the dynamic range compression characteristic in recording and the dynamic range expansion characteristic in reproducing do not correspond to each other because of the deviation of the level of reproducing signal from the level of the recording signal inasmuch as the compression and expansion degrees in such noise reduction technique are determined by the level of the signal and the frequency thereof. Consequently, the degree of dynamic range expansion during reproducing differs from the degree of dynamic range compression during recording and therefore, faithfull recording and reproducing of an audio signal cannot be performed.

SUMMARY OF THE INVENTION

The present invention has been developed in order to remove the above-mentioned disadvantages and drawbacks inherent to tape recorders used hitherto.

It is, therefore, an object of the present invention to provide an automatic recording level controlling circuit for a magnetic recording device, in which the level of a reproduced signal is maintained constant irrespectively of the variation in sensitivity of magnetic tapes.

Another object of the present invention is to provide an automatic recording level controlling circuit for a magnetic recording device, in which a compression-expansion type noise reduction system, such as Dolby noise reduction system, functions properly to faithfully reproduce the original input signal regardless of the variation in sensitivity of magnetic tapes.

In order to achieve the above-mentioned objects, the level of an input signal is so adjusted prior to recording by means of a variable loss attenuation circuit that the level of a reproduced signal is as close to a reference or standard level as possible. For this purpose, an audio test signal is recorded on a magnetic tape to see the sensitivity of a recording tape. According to the first embodiment circuit, the level of the reproduced signal will be compared with a predetermined value which is preset in the circuit to see the difference therebetween. In the second embodiment circuit the audio test signal is directly applied to a level detecting circuit firstly so that the level of the test signal per se will be used as the reference level. In both of the first and second embodiment circuits the attenuation factor of the variable loss attenuation circuit is controlled in such a manner that the level of a reproduced signal corresponding to the test signal recorded on a magnetic tape via the variable loss attenuation circuit, becomes as close to the reference value as possible.

According to the present invention, there is provided an automatic recording level controlling circuit for a magnetic recording device, comprising: (a) an audio test signal generator; (b) a switching circuit for selectively transmitting one of an input audio signal and the audio test signal; (c) a variable loss attenuation circuit responsive to the output signal of the switching circuit, the output signal of the variable loss attenuation circuit being recorded on a magnetic medium; (d) first means responsive to a signal reproduced from the magnetic medium for detecting the level of the reproduced signal corresponding to the audio test signal; (e) second means for producing a control signal in accordance with the output signal of the first means, the attenuation factor of the variable loss attenuation circuit being so adjusted by the control signal that the level of the reproduced signal is as close to a reference level as possible.

BRIEF DESCRIPTION OF THE DRAWINGS

These and other objects and features of the present invention will become more readily apparent from the following detailed description of the preferred embodiments taken in conjunction with the accompanying drawings in which:

FIG. 8 is a flow chart corresponding to the second programme of the operation steps of the control circuit shown in FIG. 6.

DETAILED DESCRIPTION OF THE PREFERRED EMBODIMENTS

Figure 1:
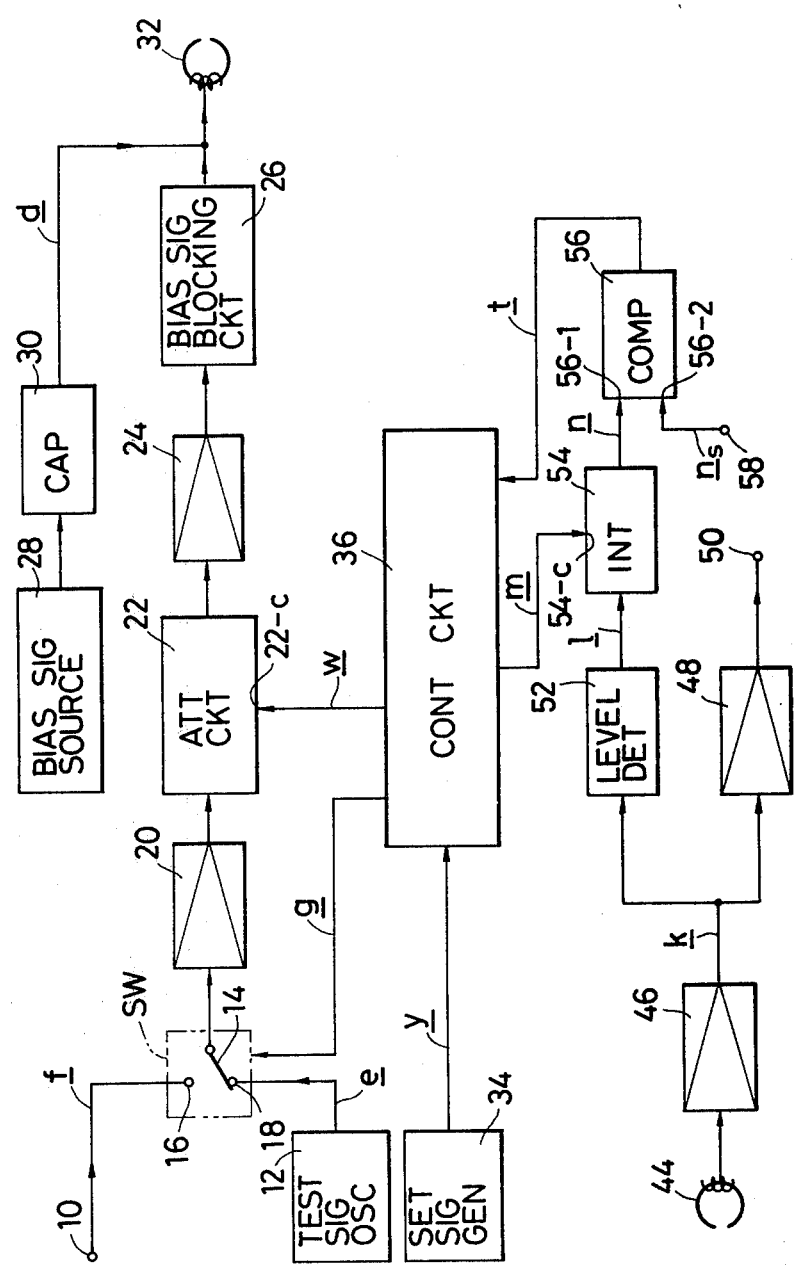
FIG. 1 shows a schematic block diagram of the first embodiment of the automatic recording level controlling circuit according to the present invention.

Referring now to FIG. 1, a schematic block diagram of a first embodiment of the automatic recording level controlling circuit for a magnetic recording device is shown. The circuit arrangement comprises an input terminal 10 for receiving an input audio signal f, a switch SW, first and second recording amplifiers 20 and 24, a variable loss attenuation circuit 22 a bias signal blocking circuit 26, a bias signal source 28, a capacitor 30, a test signal oscillator 12, a set signal generator 34, a control circuit 36, first and second reproducing amplifiers 46 and 48, a level detector 52, an integrator 54, and a comparator 56. A recording head 32 and a reproducing head 44 of a tape recorder (not illustrated) are shown to indicate the connection thereof with the circuit according to the present invention. Although in this illustrated embodiment, recording and reproducing heads are respectively employed, a single head may function as a recording and reproducing head. When a single head is used, a suitable swiching circuit may be used to switch the functions of the head so that the circuit shown in FIG. 1 may be adapted to such a single-head type tape recorder.

The bias signal source 28 produces a bias signal d when the tape recorder is set in the recording mode. This bias signal d is applied via the capacitor 30 to the recording head 32 for magnetically biasing the recording tape in such a manner that the input signal f is properly recorded on the magnetic tape. Although any type of bias signal generators may be used as the bias signal source 28, a bias level cutting circuit disclosed in the Japanese Patent Application (Application No. 53(1978)-35485) is most preferable inasmuch as the level of the bias signal is automatically set by way of an automatic examination of recording a test signal.

The input terminal 10 is connected to a first stationary contact 16 of the switching circuit SW, which has a second stationary contact 18 to which the ouput of the audio test signal oscillator 12 is connected. The test signal oscillator 12 produces an audio test signal such as a sinusoidal wave signal of 1 $KH_z$ and constant amplitude. The switching circuit has a movable contact 14 arranged to be in contact with either the first or second stationary contact 16 or 18 in response to a switching control signal g applied from the control circuit 36. The movable contact 14 is connected to an input of the first recording amplifier 20 the output of which is connected to an input of the variable loss attenuation circuit 22. The variable loss attenuation circuit 22 has a control terminal 22-C to receive an attenuation control signal w, which will be referred to as a first control signal, applied from the control circuit 36. The detailed construction of the variable loss attenuation circuit 22 will be further described hereinlater in connection with FIG. 2. The output of the variable loss attenuation circuit 22 is connected to an input of the second recording amplifier 24 the output of which is connected to an input of a bias signal blocking circuit 26. The bias signal blocking circuit 26 may be constructed by a parallel resonance circuit. The output of the bias signal blocking circuit 26 is connected to the recording head 32 while the output of the biassignal source 28 is also connected via the capacitor 30 to the recording head 32.

The set signal generator 34 is arranged to produce a set signal y when manually operated. The set signal generator 34 may include a key or button arranged on a control panel on which various keys for controlling the operation of the tape recorder are provided. The output of the set signal generator 34 is connected to the control circuit 36 to supply the set signal y thereto.

The reproducing head 44 is connected to an input of the first reproducing amplifier 46 the output of which is connected to an input of the level detector 52 and an input of the second reproducing amplifier 48. The output of the second reproducing amplifier 48 is connected to an output terminal 50 to transmit the reproduced signal k after amplifying to an external circuit such as a main amplifier. The output of the level detector 52 is connected to an input of the integrator 54 the output of which is connected to a first input 56-1 of the comparator. The integrator 54 has a control terminal 54-C connected to the control circuit 36 to receive an integration control signal m which will be referred to as a second control signal. The comparator 56 has a second input 56-2 connected to an external voltage source 58. The external voltage source 58 may comprise a voltage divider interposed between a power supply and ground to develop a predetermined voltage as a reference signal $n_s$. The output of the comparator 56 is connected to the control circuit 36 to feed the ouput signal t indicative of the result of the comparison.

Figure 2:
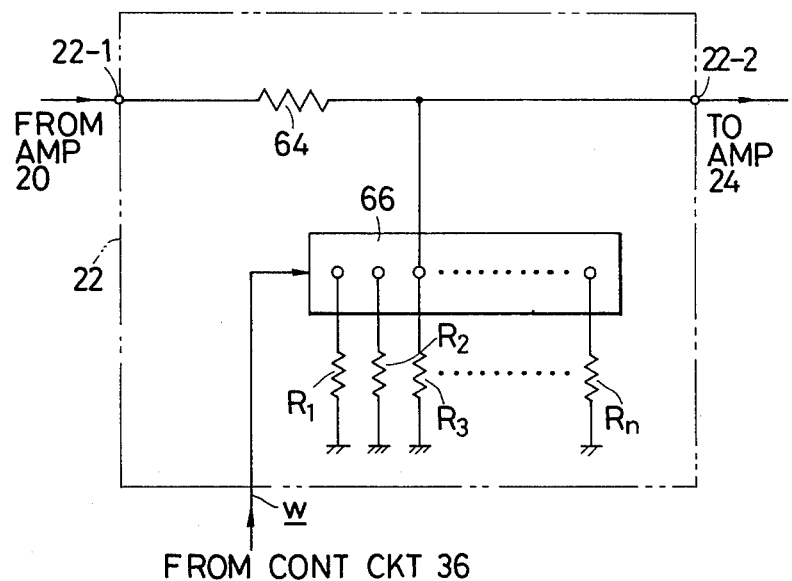
FIG. 2 shows a schematic circuit diagram of the variable loss attenuation circuit shown in FIG. 1.

FIG. 2 illustrates a detailed circuit diagram of the variable loss attenuation circuit 22 shown in FIG. 1. The variable loss attenuation circuit 22 comprises a resistor 64, an analogue multiplexer 66 (analogue selector), and a series of resistors R1 to Rn. The resistor 64 is interposed between the input 22-1 and the output 22-2 of the variable loss attenuation circuit 22 which are respectively connected to the output of the first recording amplifier 20 and the input of the second recording amplifier 24. The analogue multiplexer 66 is so connected to the output 22-2 of the variable loss attenuation circuit 22 that one of the resistors R1 to Rn and the resistor 64 constitute a voltage divider between the input 22-1 and ground.

The analogue multiplexer 66 is schematically shown to have a movable contact arranged to be in contact with one of a plurality of stationary contacts for illustrative purpose. The movable contact is connected to the resistor 64, while the stationary contacts are respectively connected via resistors R1 to Rn to ground. The connection of the movable contact with the stationary contacts is controlled by the first control signal w applied from the control circuit 36. The first control signal w may be a digital signal of N bits, and one of the resistors R1 to Rn, the number of which is $2^N$, is arranged to be connected in bridge to the signal transmission line, i.e. the output of the varaible loss attenuation circuit 22.

The resistance of the resistor R1 is the greatest among these resistors R1 to Rn and therefore, the attenuation factor will be set at the minimum when the movable contact is in contact with the resistor R1. In other words, the level of the output signal of the variable loss attenuation circuit is the highest when the movable contact is in contact with the resistor R1, while the level of the output signal is stepwisely lowered as the movable contact slides on the stationary contacts toward the rightmost one to which the resistor Rn, the resistance of which is the smallest, is connected.

Turning back to FIG. 1 the level detector 52 is, for instance, an envelope detector which detects the envelope of the output signal k of the first reproducing amplifier 46. The output signal of the level detector 52 is, therefore, indicative of the level or magnitude of the signal k. The output signal l of the level detector 52 is then integrated by the integrator 54 the function of which is periodically controlled by the second control signal m from the control circuit 36. The time constant of the integrator 54 may be set at a suitable value by means of a variable resistor to obtain a suitable integration characteristic. The output signal n of the integrator 54 is compared with a reference signal $n_s$ in voltage by the comparator 56. The comparator 56 is arranged to produce a high level output signal t when the voltage of the signal n is higher than that of the reference signal $n_s$. Although the reference signal $n_s$ may be produced by a suitable voltage divider (not shown), if the voltage divider comprises a variable resistor interposed between a power source and ground, the voltage of the reference signal $n_s$ may be manually adjusted if necessary.

The control circuit 36, which may be a logic circuit, a microprocessor or a microcomputer, is arranged to produce the first control signal w by which the variable loss attenuation circuit 22 is so controlled that a suitable attenuation factor is set in accordance with information expressed in terms of a binary code of the first control signal w. The control circuit 36 includes a counter (not shown) which counts the number of clock pulses applied from a suitable clock pulse generator (not shown) which is also included in the control circuit 36. The counter starts counting when the integrator 54 starts integration and stops counting upon presence of the high level signal t from the comparator 56.

The integrator 54 is preiodically reset to zero by the second control signal m and is further controlled by the same control signal m to start integration each time the integrator 54 has been reset. Since the second control signal m has a predetermined frequency, the duration for which the integrator 54 integrates the output signal l of the level detector 52 is constant. With this arrangement, the integrator 54 repeatedly integrates the signal l, while the counter counts the number of clock pulses each time the integrator 54 integrates the signal l.

Figure 3:
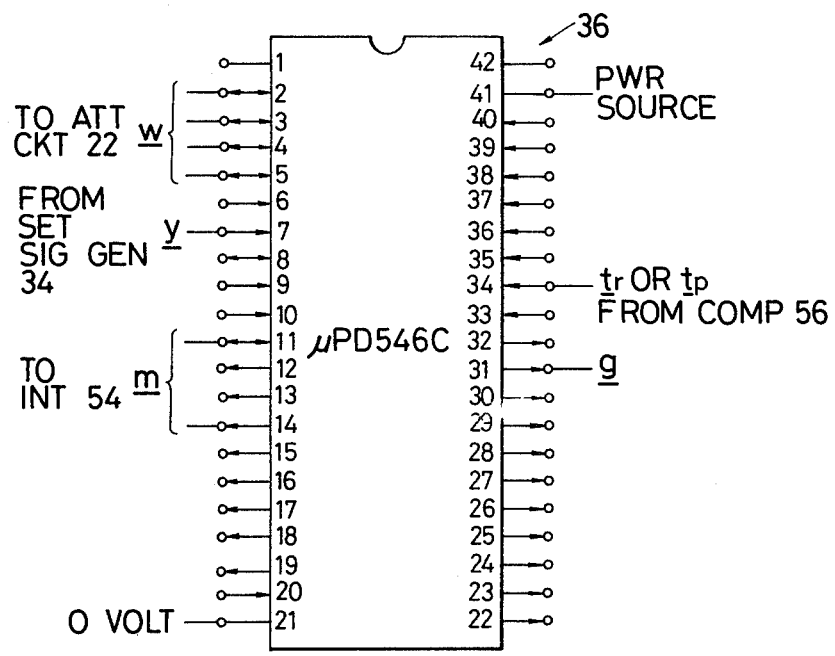
FIG. 3 shows the top view of a one-chip type microcomputer used as the control circuit shown in FIG. 1.

As mentioned hereinabove, the control circuit 36 may be a microcomputer. In this embodiment a one-chip type microcomputer is used. The microcomputer has a clock pulse generator and a counter responsive to the clock pulses. Although in this embodiment as I.C., the trade name of which is μPD546C, sold by Nihon Denki Inc. is used, other I.C. which functions in the same manner will be used instead. FIG. 3 illustrates the top view of the one-chip type microcomputer, i.e. μPD546C, and the connection between the pins thereof and other circuits shown in FIG. 1.

The control circuit 36 has first and secone memories such as registors. In the first memory a first datum $M_1$ corresponding to a predetermined value is stored, while the second memory is responsive to a second datum $M_2$ applied from the counter, which second datum is indicative of the number of pulses applied from the clock pulse generator for a period of time defined by the high level output signal t from the comparator 56. The first datum $M_1$ stored in the first memory corresponds to the optimal level of a reproduced signal, which may be obtained by an experiment using a standard recording tape. This first datum $M_1$ is preset in the first memory in advance so that the second datum $M_2$ stored in the second memory will be compared with the first datum $M_1$ stored in the first memory by means of a suitable digital comparator. It is to be noted that the second datum $M_2$ repeatedly stored in the second memory is an indication of the level of a reproduced signak k corresponding to the audio test signal e which has been prerecorded via the variable loss attenuation circuit 22.

When a noise reduction method such as Dolby noise reduction technique, in which compression of the dynamic range of a recording signal and expansion of the dynamic range of the reproduced signal are respectively performed, is adopted, the first recording amplifier 20 is so designed to have a compression characteristic by which a predetermined amount of extra amplification for low levels of the higher audio frequencies during recording is provided, while the first reproducing amplifier 46 is so designed to have an expansion characteristic by which corresponding attenuation during playback is provided to restore the audio signal to its correct level while reducing tape noise.

The operation of the first embodiment circuit shown in FIG. 1 will be described hereinbelow. The control circuit 36 is so programmed that the attenuation factor of the variable loss attenuation circuit 22 is so controlled that the level of the input audio signal f will be properly controlled. In order to control the level of the input audio signal f in the above-mentioned manner, the control circuit 36 may be programmed by either first or second programmes the flow charts of which are respectively illustrated in FIG. 4 and FIG. 5.

When the first programme is used, the attenuation factor of the variable loss attenuation circuit 2 is set at the maximum while recording the audio test signal e on a magnetic tape via the recording head 32. The recorded audio test signal e is reproduced with a predetermined time interval defined by the tape speed and the distance between the recording head 32 and the reproducing head 44. The level of the reproduced signal corresponding to the audio test signal e is detected to see whether the level of the reproduced signal is close to a predetermined value defined by the first datum $M_1$ stored in the first memory included in the control circuit 36. The attenuation factor is stepwisely lowered until the level of the reproduced signal becomes as close to the level of the predetermined value as possible.

On the other hand, when the second programme is used, the attenuation factor of the variable loss attenuation circuit 22 is not controlled stepwisely but is set instantaneously in accordance with the difference between the first datum stored in the first memory and the second datum stored in the second memory.

Figure 4:
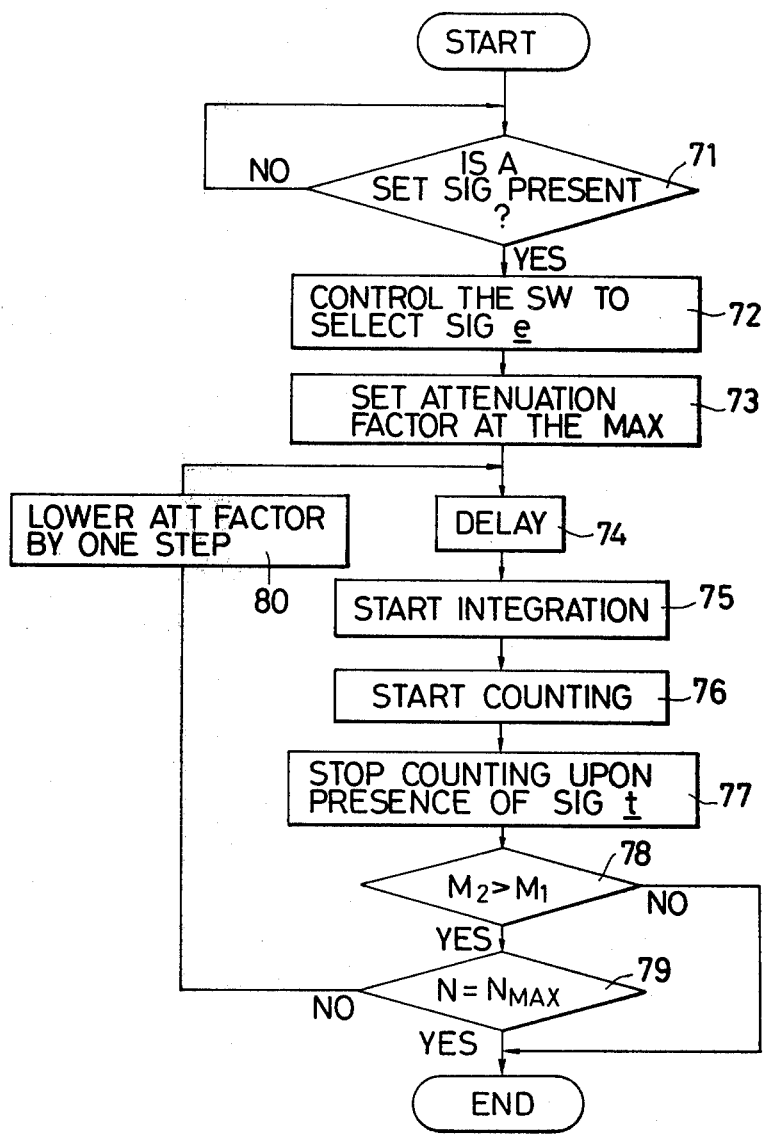
FIG. 4 is a flow chart corresponding to the first programme of the operation steps of the control circuit shown in FIG. 1.
Figure 5:
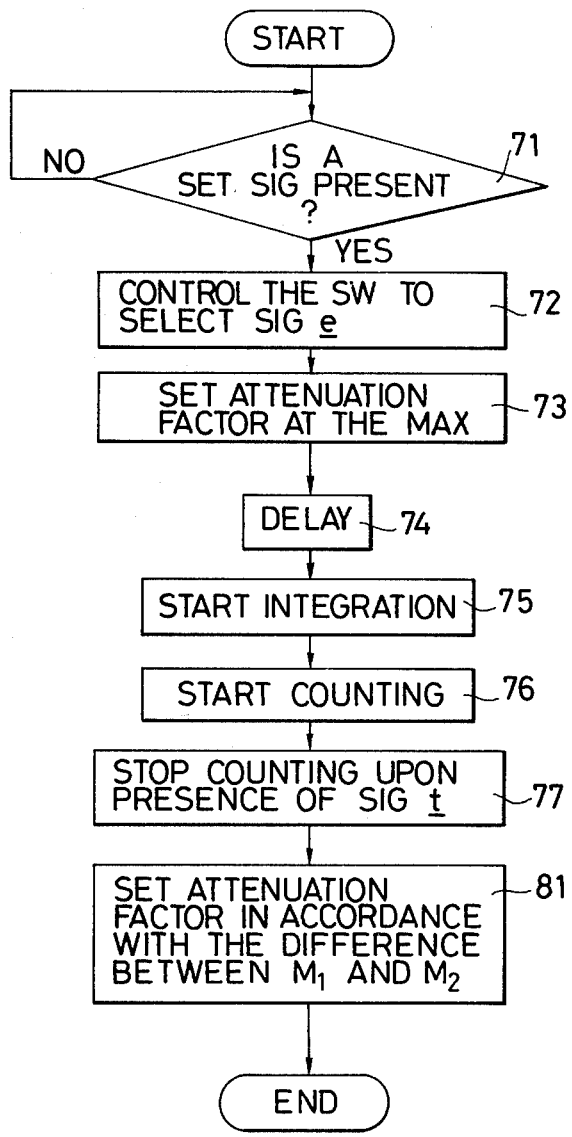
FIG. 5 is a flow chart corresponding to the second programme of the operation steps of the control circuit shown in FIG. 1.

The operation of the first embodiment circuit in connection with these first and second programmes will be further described taken in conjunction with flow charts of FIG. 4 and FIG. 5.

Upon energization of the automatic recording level controlling circuit shown in FIG. 1, which corresponds to "START" in the flow chart of FIG. 4 the programme enters the first step 71 of the operating steps. The first step 71 is an idling loop in which the presence of the signal y is detected. Upon absence of the set signal y the answer of the first step 71 is "NO" so that the operation of the control circuit 36 does not start. Upon presence of the set signal y the answer of the first step is "YES" and thus the second step 72 follows. In the second step 72 the control circuit 36 produces the switching control signal g by which the switch SW is controlled in such a manner that the movable contact 14 enters into contact with the second stationary contact 18 to feed the audio test signal e to the first recording amplifier 20. The audio test signal e is amplified to be applied to the variable loss attenuation circuit 22. A third step 73 follows the second step 72 to set the attenuation factor of the variable loss attenuation circuit at the maximum. With this operation the level of the audio test signal e is set at the minimum to be recorded on a magnetic recording tape via the second recording amplifier 24, the bias signal blocking circuit 26 and the recording head 32. Of course the bias signal is added to the audio test signal e prior to recording. The recorded audio test signal e is reproduced via the reproducing head 44 after a predetermined period of time and this reproduced signal is amplified by the first reproducing amplifier 46. In the fourth step 74 the operation of the level detecting function of the automatic recording level control circuit is retarded by the predetermined interval which corresponds to the interval required for the reproduction of the audio test signal from the time of recording the same. Of course when a single head is used to function as a recording head and a reproducing head, the recording tape has to be rewound prior to reproducing. Therefore, when such a tape recorder is used, this step of retarding has to be substituted with a step of rewinding. In the fifth step 75 the control circuit 36 produces the second control signal m by which the integrator 54 starts integration. Of course the integrator 54 is reset to zero before an integration starts. In the sixth step 76 which simultaneously occurs with the fifth step 75, the counter included in the control circuit 36 is started to count the number of clock pulses. The voltage of the output signal n of the integrator 54 increases as time goes. When the voltage of the signal n exceeds the voltage of the reference signal $n_s$, the comparator 56 produces a high level output signal t. In the seventh step 77 the counting operation of the counter is stopped upon presence of the signal t. The second datum $M_2$ stored in the counter is transferred into the second memory. In the eighth step 78 the first and second data $M_1$ and $M_2$ are compared with each other in the digital comparator to see whether the value indicated by the second datum $M_2$ is above the value indicated by the first datum $M_1$. When the answer of the eighth step 78 is "YES", the ninth step 79 follows, while when the answer of the same is "NO", the programme sequence ends so that the attenuation factor is maintained as is. Assuming that the answer of the eighth step 78 is "YES", the ninth step 79 follows in which the number N of times of lowering the attenuation factor of the variable loss attenuation circuit 22 is detected to see whether the number N has reached the maximum number of $N_{MAX}$ of steps of the stepwisely arranged attenuation factors. Of course, at the beginning, the number of times of lowering the attenuation factor is zero and therefore, the tenth step 80 follows the ninth step 79. In the tenth step 80 the control circuit 36 produces the first control signal w by which the attenuation factor of the variable loss attenuation circuit 22 is lowered by one step. After the attenuation factor is lowered by one step the audio test signal e is again recorded on the recording tape and the fourth step 74 takes place. From the foregoing, it will be understood that the steps between the fourth step 74 and the tenth step 80 constitute a loop for performing a repeated operation in which the attenuation factor is stepwisely lowered until the value of the second datum $M_2$ becomes equal to or below the value of the first datum $M_1$. When the value of the second datum $M_2$ is equal to or below the value of the first datum $M_1$, the answer of the eighth step 78 is "NO" as described hereinabove so that the programme sequence terminates. Although it is not illustrated in the flow chart, the control circuit 36 produces the switching control signal g by which the movable contact 14 of the switch SW is controlled to be in contact with the first stationary contact 16 so that the audio input signal f is fed to the first recording amplifier 20. Since the attenuation factor of the variable loss attenuation circuit 22 has been already set at the most suitable value, the input audio signal f will be recorded via the recording head 32 in such a manner that the level of a preproduced signal is maintained constant irrespectively of the variation in sensitivity of magnetic tapes.

Reference is now made to FIG. 5 which shows the flow chart of the second programme. As will be seen the steps between the first step 71 and the seventh step 77 are the same as those in the flow chart of the first programme shown in FIG. 4. According to the second programme after the seventh step 77, the difference between the value of the second datum $M_2$ and the other value of the first datum $M_1$ is detected in the step 81. In the step 81, the attenuation factor of the variable loss attenuation circuit 22 is set in accordance with the above-mentioned difference. In other words, the attenuation factor is not stepwisely lowered but one attenuation factor is selected in view of the difference between the level of the reproduced signal k and a predetermined level indicated by the first datum $M_1$ stored in the first memory. Therefore, there is no need to repeat any steps as in the first programme. After the attenuation factor is properly set, the programme sequence ends. The switch SW is controlled to feed the audio input signal f to the first recording amplifier 20 in the same manner as in the first programme so that the audio signal f will be recorded on a magnetic tape via the attenuation circuit 22 the attenuation factor of which has been so set that the level of the input audio signal f will be properly controlled prior to recording.

It will be understood from the foregoing that the level of the input audio signal f is properly controlled by the most suitable attenuation factor of the variable loss attenuation circuit 22. However, the characteristics of the level detector 52, the integrator 54, and the comparator 56 which deal with analogue signals are apt to vary due to various environmental conditions, such as the ambient temperature. When the characteristics of these circuits are influenced by the environmental conditions, the level of the reproduced signal k cannot be correctly detected. Namely, the second datum $M_2$ which will be stored in the second memory of the control circuit 36 might be erroneous. The erroneous datum causes the control circuit 36 to produce an incorrect first control signal w by which the attenuation factor of the variable loss attenuation circuit 22 will be set at a point different from a desired or aimed one.

Especially, when the before mentioned compression-expansion type noise reduction technique is adopted, the error in the level of the recording signal applied to the recording head 32 causes the level of the reproduced signal derived from the reproducing head 44 to deviate from the aimed one. This means that the compression-expansion process is not correctly performed so that the level of the original audio signal is not restored when reproducing.

Figure 6:
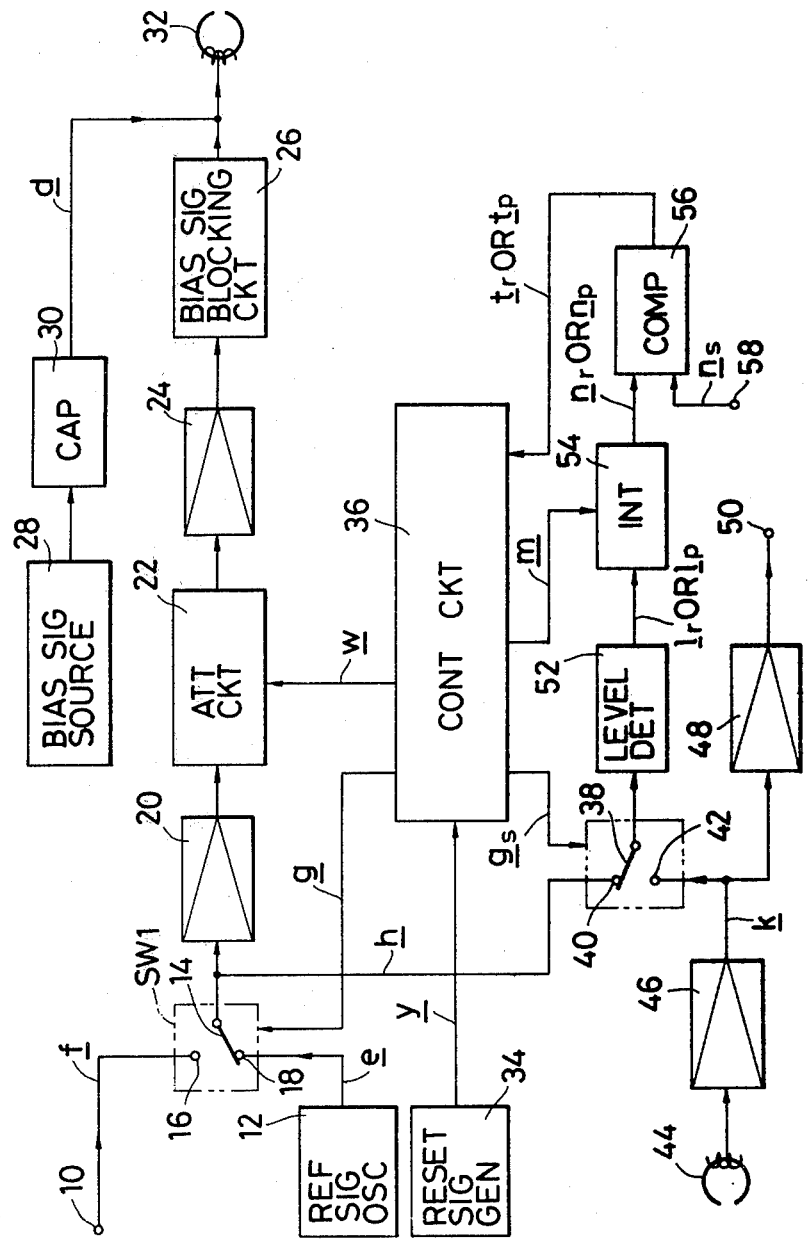
FIG. 6 shows a schematic block diagram of the second embodiment of the automatic recording level controlling circuit according to the present invention.

The second embodiment of the automatic recording level controlling circuit according to the present invention will solve the above-mentioned disadvantages. Hence, reference is now made to FIG. 6 which shows a schematic block diagram of the second embodiment. The second embodiment circuit is the same in construction as the first embodiment shown in FIG. 1 except that a second switch SW2 is additionally provided. The same elements and circuits used in the first embodiment are designated by the like reference numerals.

The second switch SW2 has a movable contact 38 and first and second stationary contacts 40 and 42. The first stationary contact 40 is connected to the movable contact 14 of the first switch SW1 to receive the output signal h of the first switch SW1, while the second stationary contact 42 is connected to the output of the first reproducing amplifier 46 to receive the reproduced signal k. The movable contact 38 of the second switch SW2 is connected to the input of the level detector 52 to feed one of the signals h and k thereto. The second switch SW2 is controlled by a second switching control signal $g_s$ applied from the control circuit 36. The operations of the second embodiment circuit will be described hereinbelow in connection with flow charts showing programmed steps of the control circuit 36.

Figure 7:
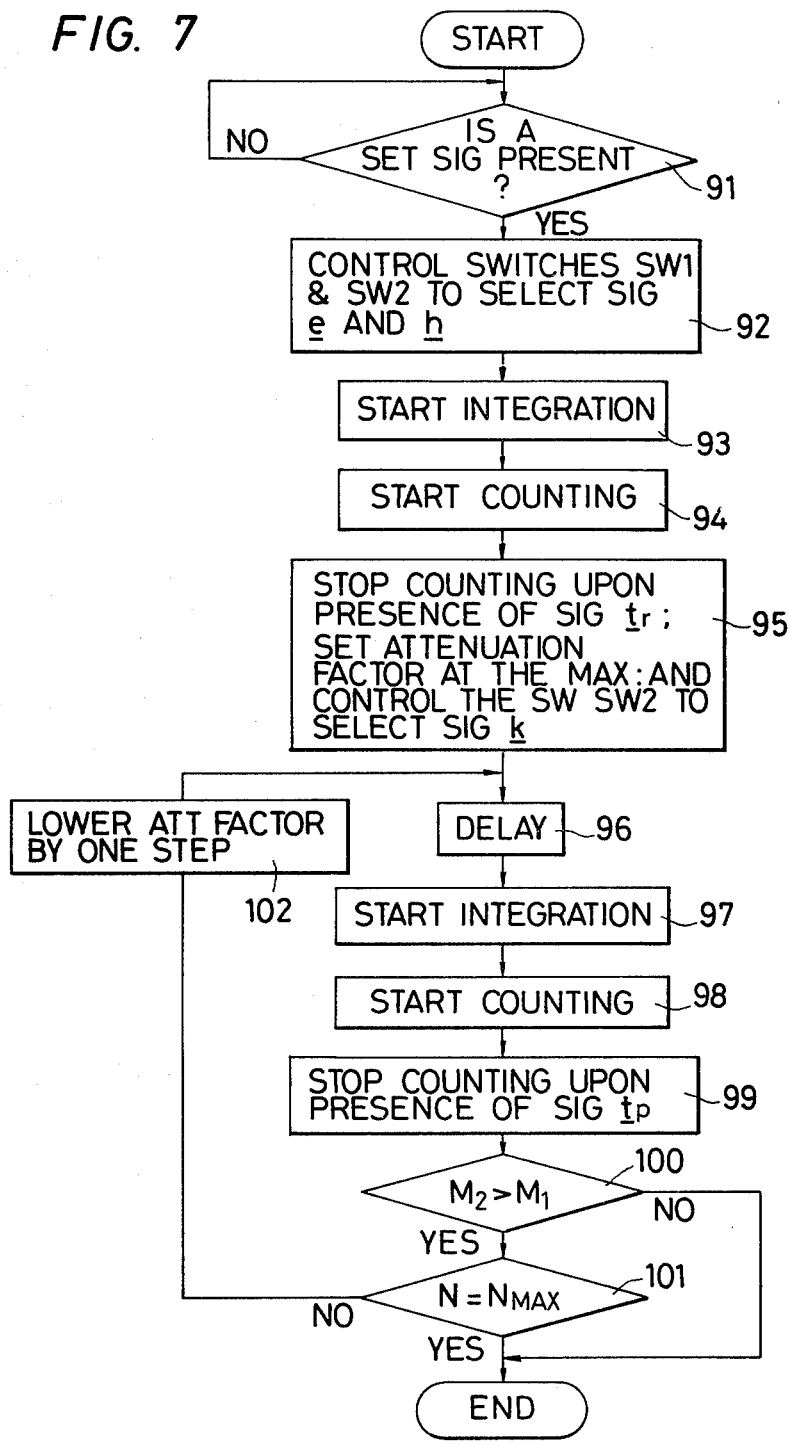
FIG. 7 is a flow chart corresponding to the first programme of the operation steps of the control circuit shown in FIG. 6.

FIG. 7 and FIG. 8 are first and second flow charts respectively corresponding to first and second programmed steps. According to the first programme of FIG. 7, twelve steps are provided. Upon energization of the automatic recording level controlling circuit shown in FIG. 6, which corresponds to "START" in the flow chart of FIG. 6 the programme enters the first step 91 of the operating steps. The first step 91 is an idling loop in which the presence of the set signal y is detected. Upon absence of the set signal y the answer of the first step 91 is "NO" so that the operation of the control circuit 36 does not start. Upon presence of the set signal y the answer of the first step 91 is "YES" and thus the second step 92 follows. In the second step 92 the control circuit 36 produces the first and second switching control signals g and $g_s$ by which the first and second switches SW1 and SW2 are respectively controlled in such a manner that the movable contact 14 of the first switch SW1 is in contact with the second stationary contact 18 thereof, while the movable contact 38 of the second switch SW2 is in contact with the first stationary contact 40. As the result of the control of the first and second switches SW1 and SW2, the audio test signal e is applied to the input of the first recording amplifier 20 and to the input of the level detector 52 since the output signal h of the first switch SW1 is the audio test signal e under this condition. The audio test signal e is applied to the level detector 52 so that the level detector 52 produces an output signal $l_r$ indicative of the level of the audio test signal e. The output signal $l_r$ of the level detector 52 is fed to the integrator 54 to be integrated therein. A third step 93 follows the second step 92 to produce the integration control signal m by which the integrator 54 is firstly reset to zero and secondly the integrator starts integration. Simultaneously in the fourth step 94 the counter included in the control circuit 36 is started to count the number of the clock pulses applied from the clock pulse generator also included in the control circuit 36. As time goes, the voltage of the output signal $n_r$ of the integrator 54 increases. The voltage of the integrator output signal $n_r$ and the voltage of the reference signal $n_s$ are compared with each other by the comparator 56. The comparator 56 produces a high level output signal $t_r$ when the voltage of the signal $n_r$ exceeds the voltage of the reference signal $n_s$. In the fifth step 95 the counting function of the counter is stopped upon presence of the output signal $t_r$ of the comparator 56. The first datum $M_1$ indicative of the number of clock pulses, stored in the counter is transferred to a first memory or a register which is also included in the control circuit. After the counting function is stopped, the control circuit 36 produces the first control signal w by which the attenuation factor of the variable loss attenuation circuit 22 is set at the maximum. Meanwhile, the control circuit 36 produces the second switching control signal $g_s$ by which the movable contact 38 of the second switch SW2 is controlled to be in contact with the second stationary contact 42.

With this operation, the level of the audio test signal e is set at the minimum to be recorded on a magnetic recording tape via the second recording amplifier 24, the bias signal blocking circuit 26 and the recording head 32. Of course the bias signal is added to the audio test signal e prior to recording. The recorded test signal e is reproduced via the reproducing head 44 after a predetermined period of time and this reproduced signal is amplified by the first reproducing amplifier 46. In the sixth step 96 the operation of the level detecting function of the automatic recording level control circuit is retarded by the predetermined interval which corresponds to the interval required for the reproduction of the test signal from the time of recording the same. The reproduced signal k is applied to the level detector 52 via the second switch SW2 and thus the level detector 52 produces an output signal $l_p$ indicative of the level of the reproduced signal k which corresponds to the audio test signal recorded via the variable loss attenuation circuit 22 the attenuation factor of which is set at the maximum. In the seventh step 97 the integrator 54 is reset to zero in the same manner as in the third step 93. The integrator 54 starts integrating the output signal $l_p$ of the level detector 52. At the same time the counter starts counting the number of clock pulses again from zero. In other words, the counter is reset to zero before counting starts. This operation is performed in the eighth step 98. As time goes, the voltage of the output signal $n_p$ of the integrator 54 increases. The voltage of the integrator output signal $n_p$ and the voltage of the reference signal $n_s$ are compared with each other by the comparator 56. The comparator 56 produces a high level output signal $t_p$ when the voltage of the signal $n_p$ exceeds the voltage of the reference signal $n_s$. In the ninth step 99 the counting operation of the counter is stopped upon presence of the output signal $t_p$ of the comparator 56. The second datum $M_2$ indicative of the number of clock pulses, stored in the counter is transferred into a second memory or a register which is also included in the control circuit 36. The first and second data $M_1$ and $M_2$ respectively stored in the first and second memories are read and compared by a digital comparator to see which is greater. The comparison of the value of the first datum $M_1$ with the value of the second datum $M_2$ is performed in the tenth step 100. When the value of the second datum $M_2$ is above the value of the first datum $M_1$, i.e. the answer of the tenth step 100 is "YES", the eleventh step follows. On the other hand when the answer of the tenth step 100 is "NO", the programmed sequence ends so that the attenuation factor is maintained as is. Assuming that the answer of the tenth step 100 is "YES", the eleventh step 101 follows in which the number N of times of lowering the attenuation factor of the variable loss attenuation circuit 22 is detected to see whether the number N has reached the maximum number $N_{MAX}$ of the steps of the stepwisely arranged attenuation factors. Of course, at the beginning, the number of lowering the attenuation factor is zero and therefore, the twelfth step 102 follows the eleventh step 101. In the twelfth step 102 the control circuit 36 produces the first control signal w by which the attenuation factor of the variable loss attenuation circuit 22 is lowered by one step. After the attenuation factor is lowered by one step the audio test signal e is again recorded on the recording tape and the sixth step 96 takes place.

From the foregoing, it will be understood that the steps between the sixth step 96 and the twelfth step 102 constitute a loop for performing a repeated operation in which the attenuation factor is stepwisely lowered until the value of the second datum $M_2$ becomes equal to or below the value of the first datum $M_1$. When the value of the second datum $M_2$ is equal to or below the value of the first datum $M_1$, the answer of the tenth step 100 is "NO" as described hereinabove so that the programme sequence terminates. Although it is not illustrated in the flow chart, the control circuit 36 produces the first switching control signal g by which the movable contact 14 of the first switch SW1 is controlled to be in contact with the first stationary contact 16 so that the audio input signal f is fed to the first recording amplifier 20. Since the attenuation factor of the variable loss attenuation circuit 22 has been already set at the most suitable value, the input audio signal f will be recorded via the recording head 32 in such a manner that the level of a reproduced signal is maintained constant irrespectively of the variation in sensitivity of magnetic tapes.

Reference is now made to FIG. 8 which shows the flow chart of the second programme. As will be seen the steps between the first step 91 and the ninth step 99 are the same as those in the flow chart of the first programme shown in FIG. 7. According to the second programme after the ninth step 99, the difference between the value of the second datum $M_2$ and the value of the first datum $M_1$ is detected in the step 103. In the step 103, the attenuation factor of the variable loss attenuation circuit 22 is set in accordance with the above-mentioned difference. In other words, the attenuation factor is not stepwisely lowered but one attenuation factor is selected in view of the difference between the level of the reproduced signal k and the level of the original audio test signal e. Therefore, there is no need to repeat any steps as in the first programme. After the attenuation factor is properly set, the programme sequence terminates. The first switch SW1 is controlled to feed the input audio signal f to the first recording amplifier 20 in the same manner as in the first programme so that the audio signal will be recorded on a magnetic tape via the attenuation circuit 22 the attenuation factor of which has been so set that the level of the input audio signal f will be properly controlled.

From the foregoing, it will be understood that according to the second embodiment the attenuation factor is so controlled that the level of the reproduced signal k corresponding to the test signal e equals to or becomes close to the level of the audio test signal e. Since the audio test signal e and the reproduced signal corresponding to the audio test signal e are respectively applied to the level detector 52 and the levels of these signals are detected by the following circuits, i.e. the integrator 54, the comparator 56 and the counter included in the control circuit 36, in the exactly same manner, the variations in characteristics of these circuits due to environmental conditions are offset. In other words, variation in circumferential condition, such as the variation in ambient temperature, does not influence the automatic recording level controlling circuit so that the level of the recording signal is suitably set at the aimed point irrespectively of these variations in various conditions.

What is claimed is:

1. An automatic recording level controlling circuit for a magnetic recording device, comprising:
   (a) an audio test signal generator;
   (b) a switching circuit for selectively passing to a recording head one of an input audio signal and said audio test signal;
   (c) a variable loss attenuation circuit responsive to the output signal of said switching circuit and coupled to said recording head, the output signal of said variable loss attenuation circuit being recorded on a magnetic medium via said recording head;
   (d) first means responsive to a signal reproduced from said magnetic medium for detecting the level of the reproduced signal corresponding to said audio test signal; and
   (e) second means for producing a control signal in accordance with the output signal of said first means, the attenuation factor of said variable loss attenuation circuit being so adjusted by said control signal that the level of said reproduced signal is as close to a reference level as possible.

2. An automatic recording level controlling circuit as claimed in claim 1, further comprising a second switching circuit for selectively coupling one of said audio test signal and said reproduced signal to said first means.

3. An automatic recording level controlling circuit as claimed in claim 2, wherein said reference level is set by detecting the level of said audio test signal.

4. An automatic recording level controlling circuit as claimed in claim 1, wherein said variable loss attenuation circuit comprises:
   (a) a resistor interposed between the input and the output of said variable loss attenuation circuit;
   (b) a plurality of resistors, each of which has one terminal connected to ground; and
   (c) switching means for selectively connecting one of said plurality of resistors to the output of said variable loss attenuation circuit in accordance with said control signal.

5. An automatic recording level controlling circuit as claimed in claim 1, wherein said first means comprises:
   (a) a level detector responsive to said reproduced signal for producing an output analogue signal indicative of the magnitude of said reproduced signal;
   (b) an integrator responsive to said analogue signal from said level detector, said integrator being periodically reset with a predetermined interval; and
   (c) a comparator responsive to the output signal of said integrator and a reference voltage to detect whether the voltage of said integrator output signal is greater than said reference voltage.

6. An automatic recording level controlling circuit as claimed in claim 1, wherein said second means comprises a microcomputer which is so programmed as to produce said control signal in accordance with the output signal of said first means.

7. An automatic recording level controlling circuit as claimed in claim 4, wherein said switching means comprises an analogue multiplexer.

8. An automatic recording level controlling circuit as claimed in claim 5, wherein said level detector comprises an envelope detector for producing an analogue signal indicative of the envelope of said reproduced signal.

9. An automatic recording level controlling circuit as claimed in claim 5, wherein said second means comprises a microcomputer which is so programmed as to produce said control signal in accordance with the output signal of said comparator, said microcomputer including:
  (a) a clock pulse generator;
  (b) a counter for counting the number of clock pulses from said clock pulse generator, said counter starting counting when said integrator starts integration and terminating counting upon presence of the output signal of said comparator;
  (c) a first memory for storing a first datum indicative of said reference level which is preset;
  (d) a second memory for storing a second datum derived from said counter; and
  (e) comparing means responsive to said first and second data.

10. An automatic recording level controlling circuit as claimed in claim 1, further comprising a recording amplifier having a dynamic range compression characteristic and a reproducing amplifier having a dynamic range expansion characteristic, said recording amplifier being interposed between said switching circuit and said variable loss attenuation circuit, said reproducing amplifier being responsive to said reproduced signal to feed an output to said first means.

11. An automatic recording level controlling circuit as claimed in claim 9, wherein said microcomputer is so programmed that the following steps are performed in a sequence:
  (a) controlling said switching circuit to select said audio test signal so as to feed the same to said variable loss attenuation circuit;
  (b) setting the attenuation factor of said variable loss attenuation circuit at the maximum;
  (c) retarding the operation of said first means by an interval required for the reproduction of the recorded audio test signal;
  (d) starting integration of said reproduced signal;
  (e) starting counting the number of said clock pulses;
  (f) stop counting the number of said clock pulses upon presence of the output signal of said comparator;
  (g) comparing said second datum with said first datum;
  (h) lowering the attenuation factor of said variable loss attenuation circuit by one step if said second datum is above said first datum, or maintaining the attenuation factor as is if said second datum is equal to or below said first datum; and
  (i) returning to said step of retarding when the attenuation factor has been lowered by one step.

12. An automatic recording level controlling circuit as claimed in claim 9, wherein said microcomputer is so programmed that the following steps are performed in a sequence:
  (a) controlling said switching circuit to select said audio test signal so as to feed the same to said variable loss attenuation circuit;
  (b) setting the attenuation factor of said variable loss attenuation circuit at a predetermined value;
  (c) retarding the operation of said first means by an interval required for the reproduction of the recorded audio test signal;
  (d) starting integration of said reproduced signal;
  (e) starting counting the number of said clock pulses;
  (f) stop counting the number of said clock pulses upon presence of the output signal of said comparator; and
  (g) comparing said second datum with said first datum to find the difference therebetween, and then setting the attenuation factor at the most suitable one in accordance with said difference.

13. An automatic recording level controlling circuit as claimed in claim 5, wherein said second means comprises a microcomputer which is so programmed as to produce said control signal in accordance with the output signal of said comparator, said microcomputer including:
  (a) a clock pulse generator;
  (b) a counter for counting the number of clock pulses from said clock pulse generator, said counter starting counting when said integrator starts integration and terminating counting upon presence of the output signal of said comparator;
  (c) a first memory for storing a first datum derived from said counter, said first datum indicating the level of said audio test signal;
  (d) a second memory for storing a second datum derived from said counter, said second datum indicating the level of the reproduced signal corresponding to said audio test signal; and
  (e) comparing means responsive to said first and second data.

14. An automatic recording level controlling circuit as claimed in claim 13, further comprising a second switching circuit for selectively transmitting one of said audio test signal and said reproduced signal to said first level detector.

15. An automatic recording level controlling circuit as claimed in claim 14, wherein said microcomputer is so programmed that the following steps are performed in a sequence:
  (a) controlling said first and second switching circuits to select said audio test signal so as to feed the same to said variable loss attenuation circuit and to said level detector;
  (b) starting integration of said audio test signal;
  (c) starting counting the number of said clock pulses;
  (d) stop counting the number of said clock pulses upon presence of the output signal of said comparator, the first datum of said counter being stored in said first memory;
  (e) setting the attenuation factor of said variable loss attenuation circuit at the maximum;
  (f) controlling said second switching circuit to select the reproduced signal corresponding to said audio test signal;
  (g) retarding the operation of said first means by an interval required for the reproduction of the recorded audio test signal;
  (h) starting integration of said reproduced signal corresponding to said audio test signal;
  (i) starting counting the number of said clock pulses;

(j) stop counting the number of said clock pulses upon presence of the output signal of said comparator;

(k) comparing said second datum with said first datum;

(l) lowering the attenuation factor of said variable loss attenuation circuit by one step if said second datum is above said first datum in value or maintaining the attenuation factor as is if said second datum is equal to or below said first datum; and (m) returning to said step of retarding when the attenuation factor has lowered by one step.

16. An automatic recording level controlling circuit as claimed in claim 14, wherein said microcomputer is so programmed that the following steps are performed in a sequence:

(a) controlling said first and second switching circuits to select said audio test signal so as to feed the same to said variable loss attenuation circuit and to said level detector;

(b) starting integration of said audio test signal;

(c) starting counting the number of said clock pulses;

(d) stop counting the number of said clock pulses upon presence of the output signal of said comparator, the first datum of said counter being stored in said first memory;

(e) setting the attenuation factor of said variable loss attenuation circuit at a predetermined value;

(f) controlling said second switching circuit to select the reproduced signal corresponding to said audio test signal;

(g) retarding the operation of said first means by an interval required for the reproduction of the recorded audio test signal;

(h) starting integration of said reproduced signal corresponding to said audio test signal;

(i) starting counting the number of said clock pulses;

(j) stop counting the number of said clock pulses upon presence of the output signal of said comparator; and (k) comparing said second datum with said first datum to find the difference therebetween, and then setting the attenuation factor of said variable loss attenuation circuit at the most suitable one in accordance with the difference.

17. An automatic recording level controlling circuit as claimed in any one of claims 11, 12, 15 and 16, further comprising a set signal generator for producing a set signal when manually operated, said microcomputer being responsive to said set signal, the programmed steps of said microcomputer further comprising a step of detecting whether said set signal is present or not for initiating the control of said attenuation factor.

18. An automatic recording level controlling circuit as claimed in claim 11 or 15, wherein said programmed steps of said microcomputer further comprise a step of detecting whether the number of lowering the attenuation factor has reached the maximum number of steps of the attenuation factors of said variable loss attenuation circuit.

19. A method of automatically controlling the recording level in a magnetic recording device, comprising the steps of:

(a) producing a test signal having a predetermined magnitude;

(b) attenuating said test signal by a predetermined amount by means of a variable loss attenuator;

(c) recording said attenuated test signal via a recording head on a magnetic medium;

(d) reproducing said test signal recorded on said magnetic medium;

(e) comparing the level of said reproduced test signal with a reference level for producing a control signal;

(f) controlling the attenuation factor of said variable loss attenuator in accordance with said control signal so that the level of said reproduced test signal is as close to said reference level as possible; and (g) supplying said variable loss attenuator with an information signal for attenuating said information signal and recording said information signal via said record head on said magnetic medium.

* * * * *